United States Patent [19]

Teggatz et al.

[11] Patent Number: 5,420,532
[45] Date of Patent: May 30, 1995

[54] SYNCHRONOUS RECTIFYING CIRCUIT

[75] Inventors: Ross Teggatz; Joe Devore, both of Dallas; Dave Cotton, Plano; Bill Grose, Dallas, all of Tex.

[73] Assignee: Texas Instruments Incorporated, Dallas, Tex.

[21] Appl. No.: 110,150

[22] Filed: Aug. 20, 1993

[51] Int. Cl.[6] .................. H03K 17/16; H03K 17/687
[52] U.S. Cl. ................................. 327/365; 327/108; 327/387
[58] Field of Search ............... 328/113, 223; 307/246, 307/270, 573, 571, 572, 271.2, 279

[56] References Cited

U.S. PATENT DOCUMENTS

| | | | |
|---|---|---|---|
| 3,168,651 | 2/1965 | Szarvas | 328/223 |
| 4,841,166 | 6/1989 | Harnden | 307/572 |
| 5,028,811 | 7/1991 | Le Roux et al. | 307/270 |
| 5,126,589 | 6/1992 | Renger | 307/270 |
| 5,276,357 | 1/1994 | Cripe | 307/270 |

Primary Examiner—Timothy P. Callahan
Assistant Examiner—My Trang Nu Ton
Attorney, Agent, or Firm—Thomas G. Eschweiler; James C. Kesterson; Richard L. Donaldson

[57] ABSTRACT

A method of efficiently turning off inductive loads includes turning off a driving switch, monitoring a circuit output during turn-off, and activating a control circuit in response to an inductive flyback voltage at the output which turns on a recirculation switch and recirculates residual load current and clamps the output thereby substantially decreasing power dissipation during inductive load turn-off.

10 Claims, 6 Drawing Sheets

SYNCHRONOUS RECTIFYING CIRCUIT

FIELD OF THE INVENTION

This invention is in the field of electronic circuits and more particularly relates to inductive load turn-off circuits.

BACKGROUND OF THE INVENTION

In circuits driving inductive loads it is often a concern to control the inductive flyback when a load is turned off. FIG. 1 is a prior art circuit 10 that illustrates a MOS transistor 12 driving an inductive load 14 in a high side driver configuration. A diode 16 is connected in parallel with load 14 as a "free-wheeling diode" to recirculate the current I from load 14 and limit the node voltage at output node OUT to a diode voltage drop (typically between 0.5–1.5 V depending upon the type of diode utilized) below circuit ground when MOS transistor 12 is turned off. Circuit 10 suffers from two problems: first, as load 14 recirculates its current I (because current cannot instantaneously change within an inductive load) the power dissipation is dictated by $V_{D16}*I$ where $V_{D16}$ is the forward biased voltage of diode 16 and I is the recirculation current. $V_{D16}$ is a fairly large voltage (approximately 0.5–1.5 V) causing an undesirably high power dissipation. This creates excessive heat and in some cases may limit the type of packages with which circuit 10 may be manufactured and may also limit the operating temperature range of circuit 10. A second problem is substrate current injection and can be seen in FIG. 2. FIG. 2 is a circuit cross-section of prior art circuit 10. When transistor 12 turns off, inductive load 14 (not shown) experiences inductive flyback which drives output node OUT negative. When output node OUT reaches a diode voltage drop below circuit ground (which is the potential of the P- substrate) the p-n junction formed at the P epi layer and the N- tank forward biases and current is pulled from the substrate. Since the substrate is resistive a voltage gradient develops along the substrate. This voltage gradient may be of large enough value such that N type tanks within the P type substrate "de-bias", thus creating potential "latch-up" conditions. Furthermore, de-biasing may cause loss of data in CMOS logic circuits. In addition to the de-biasing problem, substrate current injection can lead to latch-up and increased power dissipation.

FIG. 3 is another prior art circuit 20 that utilizes a "free-wheeling diode" 22. MOS transistor 24 is connected to diode 22 and inductive load 14 which are connected together in parallel. Circuit 20 is connected in a low side driver configuration. When transistor 24 turns off output node OUT tries to increase to a large positive voltage due to the inductive flyback of load 14. Diode 22 clamps OUT to only a forward diode voltage drop above Vdd. Diode 22 then recirculates the current I until load 14 dissipates all of its stored energy. Circuit 20 suffers from the same problems and limitations as discussed for circuit 10 of FIG. 1. During recirculation, the power dissipation is high ($V_{D22}*I$) and circuit 20 experiences substrate current injection, however, circuit 20 experiences substrate current injection in a different manner. FIG .4 explains this clearly. If the drain (tied to OUT) of transistor 24 increases to a diode drop above Vdd, a parasitic PNP transistor 26 is turned on and begins to conduct. Parasitic PNP transistor 26 is formed from P epi, the N- tank (the cathode of diode 22) and the P- tank (the anode of diode 22). This parasitic PNP action may cause significant power dissipation due to large $V_{CE}$ and substrate de-biasing with its potential problems as discussed in circuit 10 of FIG. 1.

It is an object of this invention to provide a circuit solution that recirculates the current of an inductive load during load turn-off such that power dissipation is reduced and the substrate current injection is eliminated. Other objects and advantages of the invention will become apparent to those of ordinary skill in the art having reference to the following specification together with the drawings herein.

SUMMARY OF THE INVENTION

A method of efficiently switching inductive loads using energy conservation techniques includes turning off a driving switch, monitoring a circuit output during turn-off, and activating a control circuit in response to an inductive flyback voltage at the output which turns on a recirculation switch and efficiently recirculates residual load current and clamps the output thereby substantially decreasing power dissipation during inductive load turn-off.

DETAILED DESCRIPTION OF THE PREFERRED EMBODIMENT

Figure 5:
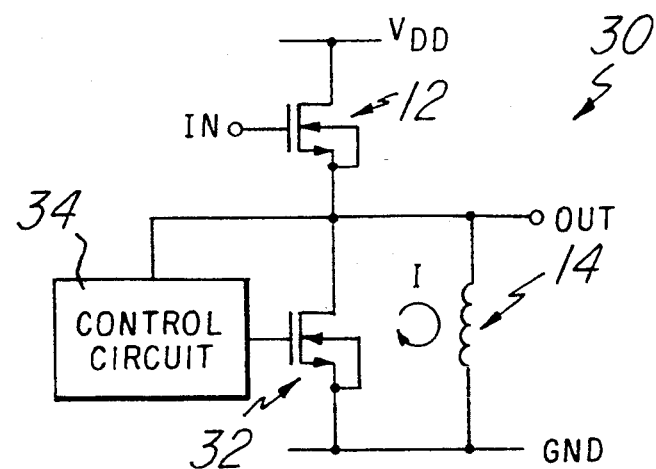
FIG. 5 is a circuit schematic illustrating the preferred embodiment of the invention in a high side driver configuration.

In the paragraphs below, a structural description of the preferred embodiment as well as alternative embodiments of the invention is provided. FIG. 5 is a circuit schematic illustrating the preferred embodiment of the invention, a high side driver synchronous rectification circuit 30. Circuit 30 includes a MOS transistor 12 having a drain connected to a power supply Vdd, a gate connected to a control input IN, a source connected to an inductive load 14, a drain of a second MOS transistor 32, and a control circuit 34. Second MOS transistor 32 has a gate connected to control circuit 34 and a source connected to circuit ground GND.

Figure 6:
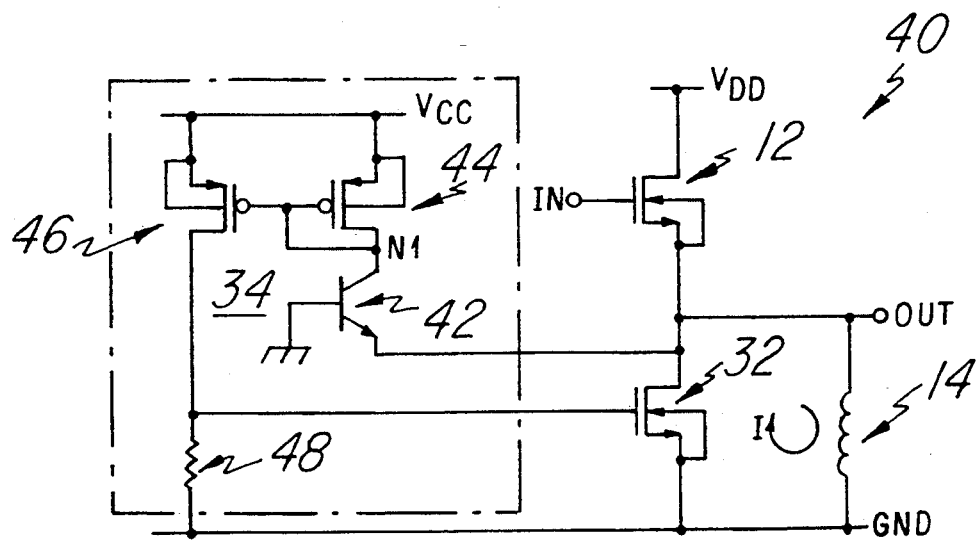
FIG. 6 is a circuit schematic illustrating an alternative embodiment of the invention in a high side driver configuration.

FIG. 6 is a circuit 40 schematic illustrating an alternative embodiment of the invention in a high side driver configuration. Control circuit 34 includes an NPN transistor 42 having an emitter connected to the source of transistor 12, a base connected to circuit ground and a collector connected to a drain of a PMOS transistor 44. PMOS transistor 44 has a gate connected to its drain and a source connected to a voltage supply Vcc. A second PMOS transistor 46 has a source connected to Vcc, a gate connected to the gate of PMOS transistor 44, and a drain connected to a resistor 48. PMOS transistor 44 and 46 form a current mirror. Resistor 48 is connected between a gate of transistor 32 and circuit ground GND. Transistor 12, which drives load 14, is connected to a control input IN. Note that input IN must be a voltage of at least a threshold voltage greater than Vdd in order to drive transistor 12 in the linear region.

Figure 7:
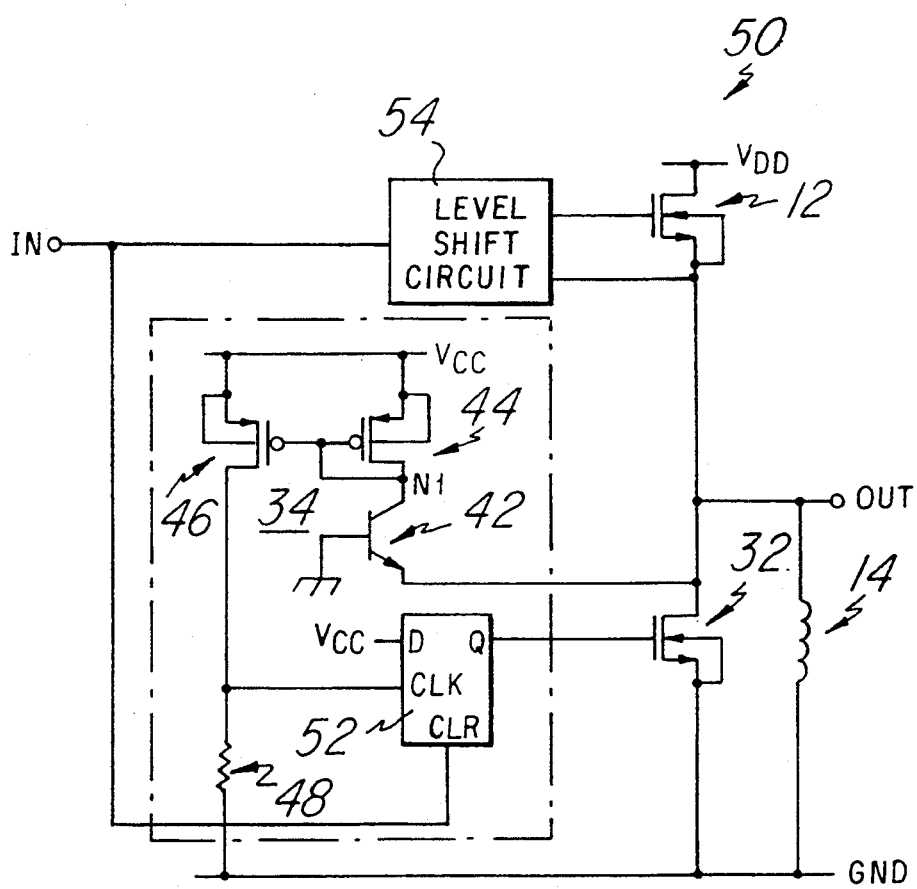
FIG. 7 is a circuit schematic illustrating another alternative embodiment of the invention in a high side driver configuration.

FIG. 7 is a circuit schematic illustrating another alternative embodiment of the invention in a high side driver configuration. Control circuit 34 includes NPN transistor 42, PMOS transistors 44 and 46 and resistor 48 configured as they were in FIG. 6. However, in FIG. 7 a positive edge triggered D-type latch 52 is connected to the gate of transistor 32. The data input "D" of latch 52 is connected to a high logic value and the "Q" output is connected to the gate of transistor 32. A CLR input is connected to a logic input IN and an enable input is connected to resistor 48. Since latch 52 may require a standard logic value input, IN is a standard logic signal and transistor 12 needs a level shift circuit 54 to boost its "high" logic value to at least a threshold voltage above Vdd so that transistor 12 can conduct.

Figure 8:
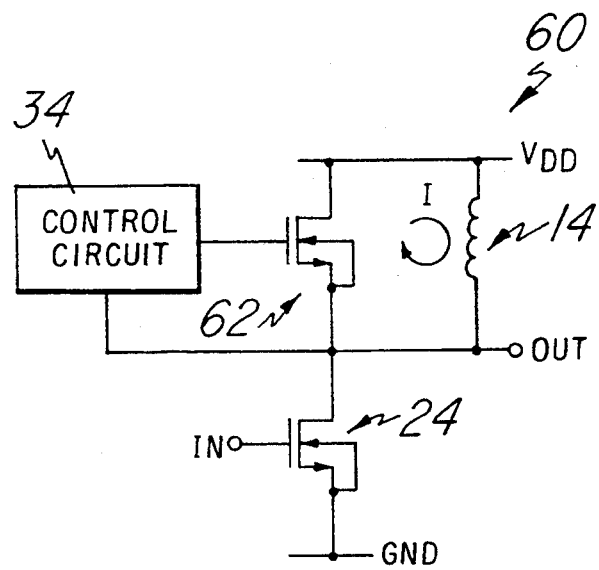
FIG. 8 is a circuit schematic illustrating the preferred embodiment of the invention in a low side driver configuration.

FIG. 8 is a circuit schematic illustrating the preferred embodiment of the invention, a synchronous rectifying circuit 60 in a low side driver configuration. Circuit 60 has a MOS transistor 24 having a source connected to circuit ground GND and a gate connected to a logic input IN. A second MOS transistor 62 has a drain connected to Vdd, a source connected to a drain of MOS transistor 24, and a gate connected to control circuit 34. Inductive load 14 is connected in parallel with transistor 62.

Figure 9:
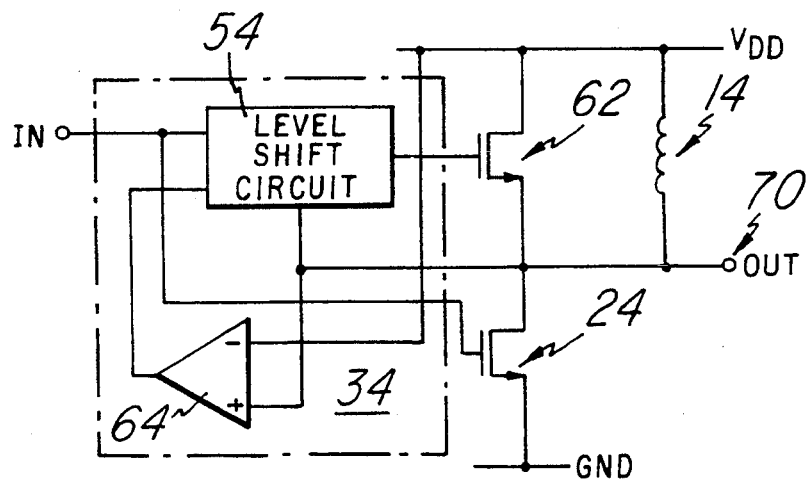
FIG. 9 is a circuit schematic illustrating an alternative embodiment of the invention in a low side driver configuration.

FIG. 9 is a circuit schematic illustrating in detail an alternative embodiment of the invention in a low side driver configuration. Control circuit 34 includes a level shift circuit 54 that boosts a logic level signal to a value at least a threshold voltage above Vdd so that transistor 62 can conduct. Level shift circuit 54 is connected to IN and OUT to determine whether load 14 is experiencing inductive flyback. A comparator 64 has an inverting input connected to Vdd and a non-inverting input connected to the output node OUT. Comparator 64 has its output connected to level shift circuit 54. Transistor 24, which drives load 14, has its gate connected to logic input IN.

Figure 10:
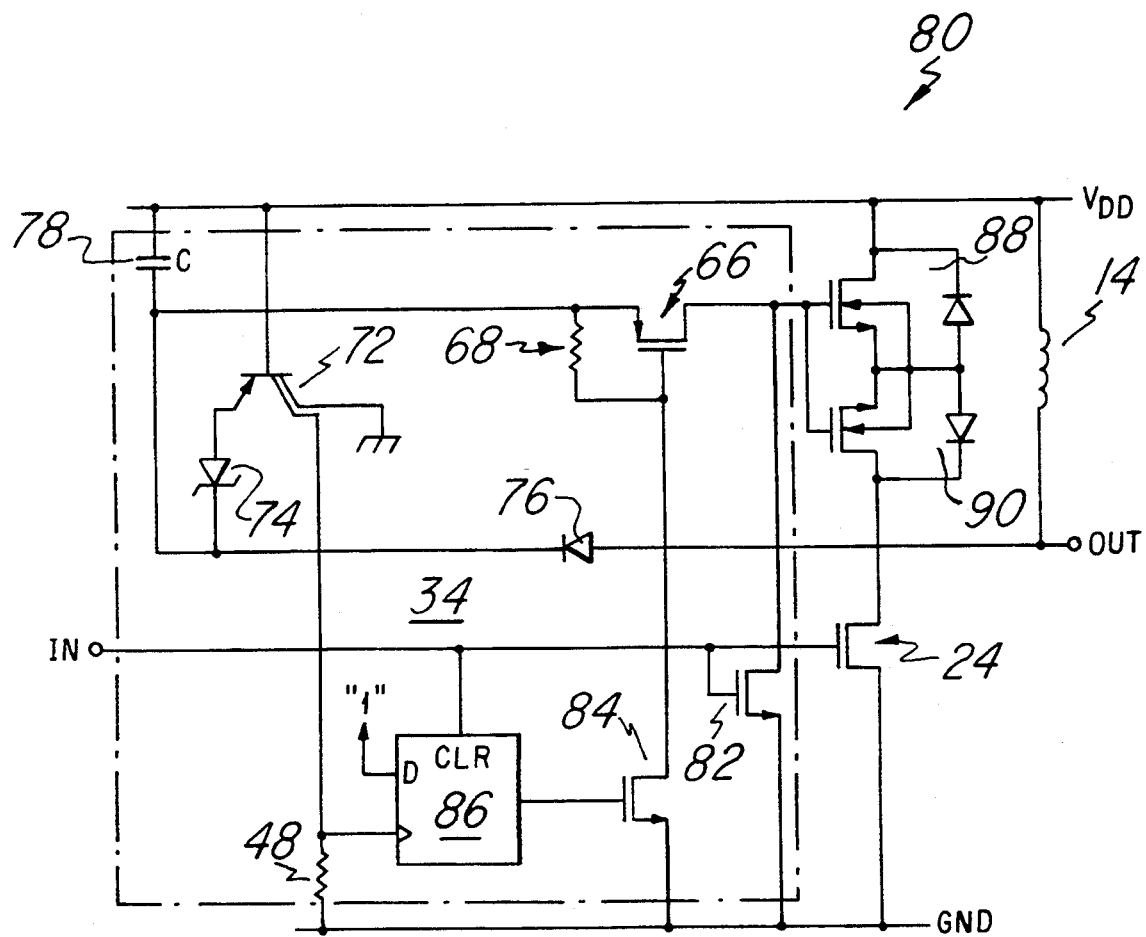
FIG. 10 is a circuit schematic illustrating another alternative embodiment of the invention in a low side driver configuration.

FIG. 10 is a circuit schematic illustrating in detail an alternative embodiment of the invention. Circuit 80 is configured such that transistor 24 still drives load 14, however two transistors 88 and 90 are connected together in series and are in parallel with load 14. The back-to-back diodes illustrated in FIG. 10 are inherent in the transistor structure. A drain of transistor 88 is connected to Vdd and a source of transistor 88 is connected to a source of transistor 90. Transistor 90 has a drain connected to the drain of transistor 24. A gate of transistor 88 is connected to a gate of transistor 90. Control circuit 34 includes a PMOS transistor 66 having a drain connected to the gate of transistor 88 and a source connected to a resistor 68. Resistor 68 is connected between the source and a gate of PMOS transistor 66. The source of PMOS transistor 66 is also connected to a first plate of a capacitor 78. A second plate of capacitor 78 is connected to Vdd. The first plate of capacitor 78 is also connected to a cathode of a zener diode 74 and a cathode of a diode 76. Diode 76 has an anode connected to the drain of transistor 90. Zener diode 74 has an anode connected to an emitter of a PNP transistor 72. PNP transistor 72 has a base connected to Vdd, a first collector connected to circuit ground, and a second collector connected to resistor 48 which in turn is connected to circuit ground. Resistor 48 is also connected to an enable input of a D-type latch 86. Latch 86 has a data input "D" connected to a high logic value and a clear input connected to an input logic control signal IN that also serves as the gate control voltage for transistor 24. Latch 86 also has a "Q" output connected to a gate of an NMOS transistor 84. NMOS transistor 84 has a drain connected to the gate of PMOS transistor 66 and a source connected to circuit ground. Another NMOS transistor 82 has a gate connected to logic control input IN, a drain connected to the gates of transistors 88 and 90, and a source connected to circuit ground.

Figure 11:
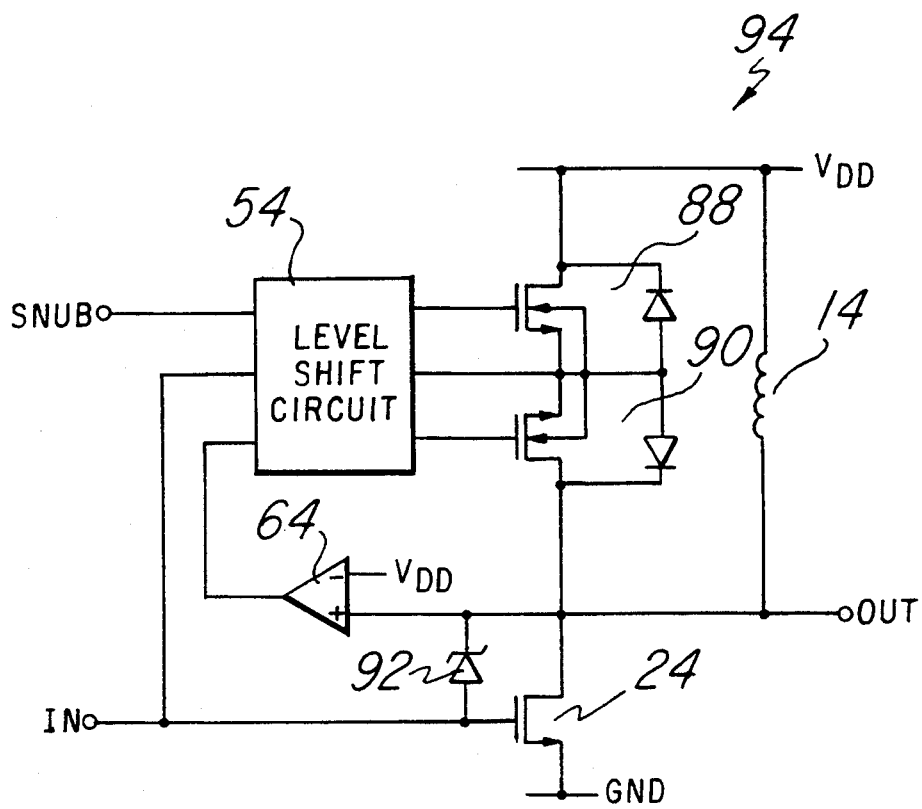
FIG. 11 is a circuit schematic illustrating yet another alternative embodiment of the invention in a low side driver configuration.

FIG. 11 is a circuit schematic illustrating another alternative embodiment of the invention. Circuit 94 has transistors 88 and 90 connected as in FIG. 10. A zener diode 92 is connected between the drain and source of transistor 24. The gate of transistor 24 is also connected to the input IN. Comparator 64 has its non-inverting input connected to OUT and its inverting input connected to Vdd. The output of comparator 64 is connected to level shift circuit 54 which takes as inputs IN, SNUB and the output of comparator 64 and outputs control signals to transistors 88 and 90.

A functional description of the preferred embodiment of the invention in a high side driver configuration is as follows. In FIG. 5, when input IN is at a voltage value greater than a threshold voltage above Vdd, transistor 12 is conducting and driving inductive load 14. Transistor 12 may be considered a driving switch and although it is a MOS type transistor, it should be understood that other type drive elements would also fall within the scope of the invention. Inductive load 14 may include a motor, solenoid or any load that has an inductive component. When IN drops to approximately 0 V transistor 12 turns off. Since current cannot instantaneously change through an inductor, inductive load 14 experiences a negative flyback according to the equation: $V = L(di/dt)$. Therefore, the voltage at output node OUT begins to go negative. Control circuit 34, which monitors OUT, sees that OUT is going low and outputs a voltage value to the gate of transistor 32 that is at least a threshold voltage greater than ground potential, turning transistor 32 on. Transistor 32, in this particular embodiment, is an optimized lateral DMOS transistor that has an extremely low Rds(on) (on resistance). Transistor 32 therefore begins conducting, thus recirculating the current I from load 14. Therefore, transistor 32 may be thought of as a recirculation switch. Transistor 32 advantageously has a voltage across it of $V_{ds}$ which is a function of $R_{ds(on)}*I$. Because the $R_{ds(on)}$ of transistor 32 can be designed to be small the $V_{ds}$ of transistor 32 can be reduced for a given design. However, the prior art free wheeling diode 16 is limited to a voltage drop between 0.5–1.5 V. It is important to note that the $V_{ds}$ of transistor 32 is a function of transistor area and may vary. Since transistor 32 only allows node OUT to fall a $V_{ds}$ below ground and since $V_{ds}$ is significantly smaller than 0.5–1.5 V, the power dissipation during load 14 turn-off is significantly smaller. Power dissipation is calculated by: $P_{(diss)} = V_{ds}*I$. Thus for a given recirculation current I, circuit 30 can significantly reduce the power dissipation during load 14 turn-off compared to prior art flyback diode 16. Again, the reduction in power dissipation may vary depending upon the size of transistor 32 in one's circuit. This dramatic reduction in power dissipation allows a designer to utilize less expensive IC packages thus reducing the cost of the product and increasing the scope of the circuit's 30 applicability. Circuit 30 of FIG. 5 also eliminates substrate injection current by routing all recirculation current through transistor 32. The significant decrease in voltage across transistor 32 ($V_{ds}$) as compared with the forward biased diode drop of diode 16 assures that no p-n junctions become forward biased and in this case no parasitics exist. There is also no substrate de-biasing, therefore, latch-up problems are eliminated as well as the elimination of potential data loss in logic registers or interference with any analog circuits that may be present.

Circuit 30 is called a synchronous rectifying circuit because control circuit 34 is synchronized with load 14 turn-off, thus automatically activating transistor 32 for recirculation. Also, although circuit 30 utilizes an optimized low $R_{ds(on)}$ lateral DMOS transistor for recirculation transistor 32, it should be understood that any type of switching element could be used. For example, a standard NMOS transistor or various type PMOS transistors may be used, or a bipolar type transistor could also be used. Any type switch that would provide less voltage drop across load 14 than prior art free-wheeling diode 16 would be desirable.

Turning now to FIG. 6, FIG. 6 is a circuit 40 schematic diagram illustrating an alternative embodiment of the invention in a high side driver configuration. During load 14 turn-off node OUT attempts to drop to a large negative voltage value due to the inductive flyback of load 14. As OUT goes low, NPN transistor 42 begins conducting due to its base-emitter junction becoming forward biased. Since PMOS transistor 44 is in a current mirror configuration with MOS transistor 46, a current proportional to the current in PMOS transistor 44 will conduct through PMOS transistor 46. The magnitude of the current through MOS transistor 46 will depend upon the (W/L) size ratios of PMOS transistors 44 and 46. The current conducting through PMOS transistor 46 creates a voltage across resistor 48. When the voltage across resistor 48 increases to a threshold voltage above ground potential, transistor 32 begins conducting thus clamping output node OUT to a $V_{ds(M32)}$ below ground while recirculating the current I remaining in load 14. Resistor 48 may alternatively be replaced with a generic pull down circuit. A pull down circuit pulls the gate of transistor 32 low when transistors 44 and 46 stop conducting thereby ensuring transistor 32 is completely off and eliminating leakage. Pull down circuit may include an active component such as a transistor. Any type of component, either active or passive, that would effectively pull the gate of transistor 32 low when transistors 44 and 46 stop conducting would be considered appropriate.

With respect to FIG. 7, FIG. 7 is a circuit 50 schematic diagram illustrating another alternative embodiment of the invention in a high side driver configuration. When transistor 12 turns off, load 14 experiences inductive flyback and node OUT attempts to drop to a negative voltage value. As OUT goes negative NPN transistor 42 begins conducting, drawing current from a current mirror composed of PMOS transistors 44 and 46. PMOS transistor 46 conducts a current that is proportional to the current through PMOS transistor 44. When transistor 12 was turned out a logic IN signal had gone to a low value thus turning transistor 12 off through level shift circuit 54. Level shift circuit 54 boosts the gate voltage at IN when IN is a high logic voltage value so that the gate of transistor 12 can go at least a threshold voltage above Vdd. When IN has gone low and transistor 12 has turned off, the CLR input of latch 52 goes low thus allowing latch 52 to function according to its data and clock (or edge triggered) inputs. The current through PMOS transistor 46 develops a voltage across resistor 48 that serves as a clock input to latch 52. When the voltage across resistor 48 generates a low-to-high transition, latch 52 latches a high logic voltage value onto the gate of transistor 32, thus turning transistor 32 on and clamping the node OUT at $V_{ds(M32)}$ below ground while load 14 recirculates remaining current I. When IN switches again and goes to a high logic voltage value it clears latch 52 thus ensuring that transistor 32 is off when transistor 12 is conducting a large surge of current between transistors 12 and 32 is prevented. Level shift circuit 54, as discussed earlier, boosts the gate voltage on transistor 12 to efficiently turn it on.

Figure 1:
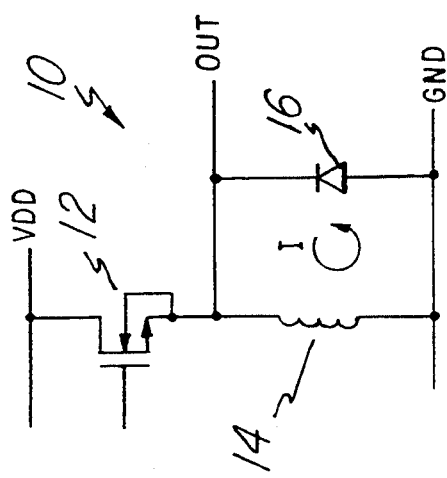
FIG. 1 is a circuit schematic illustrating a prior art circuit 10 utilizing a high side driver configuration with a "free-wheeling diode".
Figure 2:
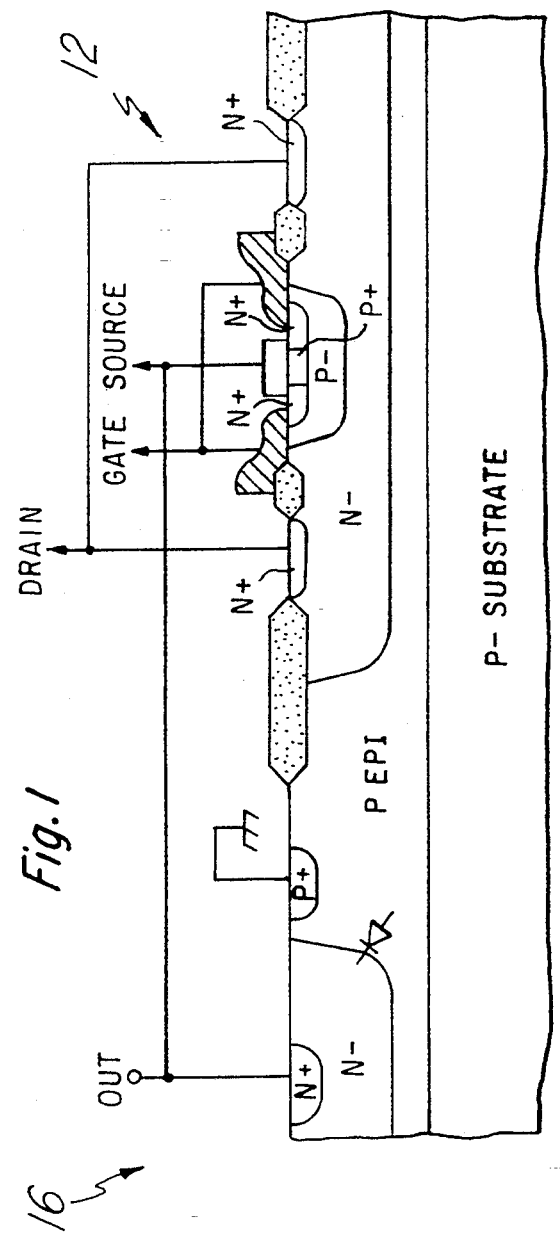
FIG. 2 is a cross-section drawing illustrating the integrated circuit realization of prior art circuit 10 of FIG. 1.
Figure 3:
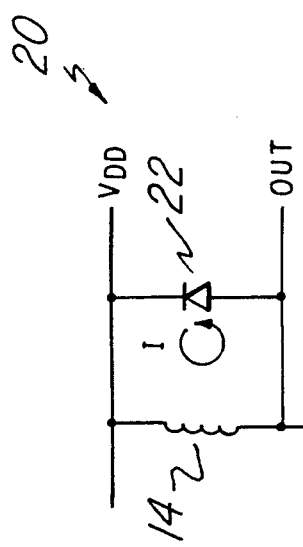
FIG. 3 is a circuit schematic illustrating a prior art circuit 20 utilizing a low side driver configuration with a "free-wheeling diode".
Figure 4:
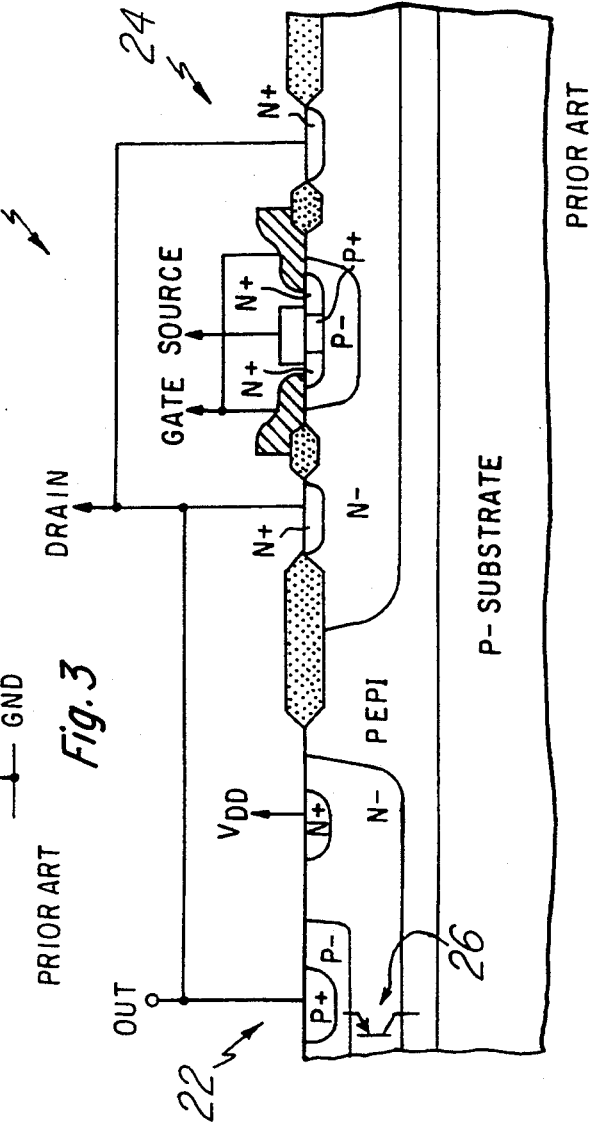
FIG. 4 is a cross-section drawing illustrating the integrated circuit realization of prior art circuit 20 of FIG. 3.

Turning now to FIG. 8, FIG. 8 is a circuit 60 schematic illustrating the preferred embodiment of the invention in a low side driver configuration. When logic input IN is at a voltage greater than the threshold voltage of transistor 24, transistor 24 is conducting and driving load 14. Transistor 24 can be thought of as a driving switch. When IN falls below the threshold voltage of transistor 24, transistor 24 turns off which induces a positive inductive flyback at output node OUT according to the equation $V = L(di/dt)$. As OUT increases above Vdd control circuit 34, which monitors output node OUT, is activated and outputs a voltage value to the gate of transistor 62 that is at least a threshold voltage greater than Vdd, turning transistor 62 on. Transistor 62, in this particular embodiment, is an optimized lateral DMOS transistor that has an extremely low $R_{ds(on)}$. Transistor 62 begins conducting, thus recirculating the current I from load 14. Transistor 62 may be thought of as a recirculation switch. Transistor 62 advantageously has a voltage across it of $V_{ds}$ which is a function of $R_{ds(on)}*I$. Because the $R_{ds(on)}$ is extremely small the $V_{ds}$ of transistor 62 is significantly lower than the forward biased diode drop of prior art free-wheeling diode 22 of FIG. 3. Since transistor 62 only allows node OUT to increase a $V_{ds}$ above Vdd and since $V_{ds}$ is significantly smaller than the forward biased diode voltage drop, the power dissipation during load 14 turn-off is significantly smaller. Thus circuit 60 greatly reduces the power dissipation during load 14 turn-off. As discussed earlier, the degree to which $V_{ds}$ and $P_{(diss)}$ is reduced is a function of the size of transistor 62 used in one's circuit. The dramatic reduction in power dissipation advantageously allows a designer to utilize less expensive IC packages thus reducing the cost of the product and increasing the scope of the circuit's applicability. Furthermore, circuit 60 eliminates substrate current injection by routing the current through transistor 62, which in this particular embodiment is a lateral DMOS transistor, and by limiting the voltage at OUT to only a $V_{ds(M62)}$ above Vdd. Since $V_{ds(M62)}$ is less than a diode voltage drop, no p-n junctions are inadvertently forward biased and no parasitic PNP transistor exists since diode 22 was eliminated. Thus problems such as substrate current injection, latch-up and loss of data on logic circuitry are eliminated.

Although circuit 60 utilizes an optimized low $R_{ds(on)}$ lateral DMOS transistor for recirculation transistor 62, it should be understood that any type of switching element could be used. For example, a standard NMOS transistor or various type PMOS transistors may be used, or a bipolar type transistor could also be used. Any type switch that would provide less voltage drop across load 14 than prior art free-wheeling diode 22 would be desirable.

With respect to FIG. 9, FIG. 9 is a circuit 70 schematic diagram illustrating an alternative embodiment of the invention in a low side driver configuration. When logic input IN is at a voltage value greater than the threshold voltage of transistor 24, transistor 24 is conducting and driving load 14. When IN falls below the threshold voltage of transistor 24, transistor 24 turns off and load 14 induces an inductive flyback at node OUT and OUT tries to increase to a large positive voltage value according to the equation V=L(di/dt). As OUT begins to increase the output of comparator 64 switches, thus forming a high logic voltage value on its output. The high logic voltage value along with a low logic voltage value from IN forms inputs to level shift circuit 54 which boosts the high logic voltage value to a value that is at least a threshold voltage above Vdd. The "boosted" voltage drives the gate of transistor 62 turning it on. When transistor 62 conducts, the node OUT is clamped to a voltage that is a $V_{ds(62)}$ greater than Vdd where $V_{ds(M62)}$=Rds(on)*I wherein Rds(on) is the "on" resistance of transistor 62 and I is the recirculation current in load 14. Circuit 70 is called a synchronous rectifying circuit because control circuit 34 composed of comparator 64 and level shift circuit 54 are activated by the state of node OUT. Thus control circuit 34 is automatically activated when transistor 24 turns off. Alternatively, comparator 64 may be replaced with a differentiator circuit which triggers on a rapidly rising voltage on OUT which occurs during inductive flyback conditions.

Now turning to FIG. 10, FIG. 10 is a circuit 80 schematic diagram illustrating another alternative embodiment of the invention. When logic input IN is at a voltage greater than the threshold voltages of transistor 24, transistor 24 is conducting and driving load 14. Additionally, transistor 82 is on, pulling the gates of transistors 88 and 90 to a low value thus ensuring that transistors 88 and 90 cannot conduct. When logic input IN goes to a low voltage value, transistor 24 turns off resulting in an inductive flyback at output node OUT. Output node OUT attempts to increase to a large positive voltage value according to the equation V=L(di/dt). As OUT increases, diode 76 is forward biased and begins conducting, thus charging up capacitor 78. The voltage across capacitor 78 continues to increase until it is limited by the breakdown voltage of zener diode 74 and the base emitter voltage of PNP transistor 72. When this voltage across capacitor 78 is reached, current flows through zener diode 74 and a collector of PNP transistor 72 through resistor 48, wherein a voltage develops across resistor 48. When logic input IN went low it also disabled the clear input of latch 86 thus allowing its "Q" output to reflect the state of its data and clock inputs. When the voltage across resistor 48 generates a low-to-high transition, latch 86 triggers a high logic value which is latched on its "Q" output thus turning transistor 84 on. When transistor 84 turns on, it pulls the gate of PMOS transistor 66 low which turns transistor 66 on. When transistor 66 turns on the charge that had developed across capacitor 78 is shared at the gates of transistors 88 and 90 thus turning them on. Transistors 88 and 90 conduct and recirculate the current from load 14. Transistors 88 and 90 also clamp the voltage at output node OUT to a voltage that equals Vds(M88)+Vds(M90). Vds(M88)+Vds(M90) is designed to be significantly less than prior art free-wheeling diode 22 of FIG. 3. Source connected transistors 88 and 90 also provide an additional advantage of providing an extra drive alternative which is to allow a user to quickly dissipate the energy in load 14 by disabling recirculation and allowing node OUT to flyback to a large value (approximately 60 V). This gives fast turn-off since current in load 14 is quickly reduced to zero. This functionality is best described in conjunction with FIG. 11.

In FIG. 11 a user has two options; either to recirculate the current from load 14 through transistors 88 and 90 as described for FIG. 10 or to quickly turn-off load 14 through "snubbing" which is well known by those skilled in the art. In a "snub" mode transistors 88 and 90 are off and prevent recirculation through backgate diodes which are inherent in transistors 88 and 90. Circuit 94 turns load 14 off instead of recirculating current through transistors 88 and 90 through use of a SNUB input. When SNUB is at a high logic voltage value, level shift circuit 54 turns off transistors 88 and 90. As OUT increases to a large voltage value due to inductive flyback zener diode 92 breaks down thus turning transistor 24 back on and quickly dissipating the energy in load 14.

Although the invention has been described with reference to the preferred embodiment herein, this description is not to be construed in a limiting sense. Various modifications of the disclosed embodiment as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A synchronous rectifying circuit, comprising:
   a driving switch connected between a first voltage source and an inductive load, and having a control terminal of the driving switch connected to an input, the connection between the driving switch and the inductive load forming an output;
   a recirculation switch connected between the driving switch and a second voltage source, being in parallel with the inductive load, wherein the first voltage source is greater than the second voltage source and the circuit forms a high side driver; and
   a control circuit connected to the output and a control terminal of the recirculation switch, wherein the control circuit monitors the output and activates the recirculation switch when an inductive flyback voltage occurs at the output thereby recirculating current from the inductive load which decreases the power dissipation during inductive load turn-off, wherein the control circuit comprises:

a first switch having a first terminal connected to the output and a control terminal connected to the second voltage source;

a current mirror having a first terminal connected to a second terminal of the first switch and having a second terminal;

a pull down circuit having a first terminal connected to the second terminal of the current mirror and the control terminal of the recirculation switch, and having a second terminal connected to the second voltage source; and operable to turn on the recirculation switch during inductive flyback by turning the first switch on which sinks a current from the current mirror, the current mirror also providing a mirrored current to the resistance that is proportional to the current in the first switch, the mirrored current forming a voltage across the resistance and thus at the control terminal of the recirculation switch that is large enough in magnitude to turn on the recirculation switch which clamps the voltage at the output to within an "on" voltage of the recirculation switch of the second voltage source thereby reducing the power dissipation of the circuit during inductive load turn-off.

2. The circuit of claim 1 wherein the first switch is a bipolar NPN transistor.

3. The circuit of claim 1 wherein the pull down circuit comprises an active resistance that behaves as a current controlled voltage source.

4. The circuit of claim 1 wherein the pull down circuit comprises a passive resistance.

5. The circuit of claim 1 wherein the current mirror comprises:

a first PMOS transistor having a drain connected to the second terminal of the first switch, a gate connected to its drain, and a source connected to a third voltage source, the third voltage source being greater than the second voltage source; and a second PMOS transistor having a drain connected to the first terminal of the resistance, a gate connected to the gate of the first PMOS transistor, and a source connected to the third voltage source.

6. The circuit of claim 1 wherein the control circuit further comprises:

a latch connected between the first terminal of the resistance and the control terminal of the recirculation switch; and operable to pass a high voltage value to the control terminal of the recirculation switch when the value of the voltage across the resistance reaches a critical value.

7. The circuit of claim 6 wherein the latch further comprises:

a D-type latch wherein the first terminal of the resistance is connected to an edge triggered clock, the high voltage value is connected to a data input, the input of the circuit is connected to a clear input, and the control terminal of the recirculation switch is connected to latch output, wherein when the input of the circuit is at a low voltage value the clear input is disabled, thereby allowing the output of the D-type latch to latch to a high voltage value when the edge triggered clock input reaches a critical voltage value.

8. The circuit of claim 1 wherein the recirculation switch is a lateral double diffused MOS transistor.

9. A synchronous rectifying circuit, comprising:

a driving switch connected between a first voltage source and an inductive load, and having a control terminal of the driving switch connected to an input, the connection between the driving switch and the inductive load forming an output;

a recirculation switch connected between the driving switch and a second voltage source, being in parallel with the inductive load, wherein the first voltage source is greater than the second voltage source and the circuit forms a low side driver; and a control circuit connected to the output and a control terminal of the recirculation switch, wherein the control circuit monitors the output and activates the recirculation switch when an inductive flyback voltage occurs at the output thereby recirculating current from the inductive load which decreases the power dissipation during inductive load turn-off, wherein the control circuit comprises:

a comparator having a first input connected to the output, a second input connected to the second voltage source, and an output;

a level shift circuit having an input connected to the output of the comparator and an output connected to the control terminal of the recirculation switch; and operable to sense an inductive flyback voltage at the output by comparing the voltages at the first input and second input of the comparator and output a high logic voltage value to the level shift circuit when inductive flyback at the output is detected, and the level shift circuit boosts the voltage magnitude at its input to ensure that the voltage at the control terminal of the recirculation switch is large enough to turn the recirculation switch on.

10. The circuit of claim 9 wherein the control circuit comprises:

a third PMOS transistor having a drain connected to the control terminal of the recirculation switch, a gate, and a source;

a second resistance connected between the gate and the source of the third PMOS transistor;

a capacitance having a first terminal connected to the second voltage source and a second terminal connected to the source of the third PMOS transistor;

a diode having an anode connected to the output and a cathode connected to the second terminal of the capacitor;

a zener diode having an anode and a cathode, the cathode being connected to the cathode of the diode;

a PNP transistor having an emitter connected to the anode of the zener diode, a base connected to the second voltage source, a first collector connected to the first voltage source and a second collector;

a third resistance having a first terminal connected to the second collector of the PNP transistor and a second terminal connected to the first voltage source;

a latch having an enable input connected to the first terminal of the third resistance, a data input connected to a high logic voltage value, a clear input connected to the input of the circuit, and an output;

a first NMOS transistor having a drain connected to the gate of the third PMOS transistor, a gate connected to the output of the latch, and a source connected to the-first voltage source;

a second NMOS transistor having a drain connected to the control terminal of the recirculation switch, a gate connected to the input of the circuit, and a source connected to the first voltage source; and operable to monitor the output for inductive flyback and activate the recirculation switch by conducting current through the diode during inductive flyback by charging up the capacitance via the diode and discharging the capacitance to the control terminal of the recirculation switch via the zener diode, the PNP transistor, the third resistance, the latch, the first NMOS transistor and the third PMOS transistor wherein the recirculation switch turns on thereby circulating residual current in the inductive load and clamping the output to within the second voltage source voltage value plus an "on" voltage of the recirculation switch and decreasing the circuit power dissipation during inductive load turn-off.

* * * * *